United States Patent [19]
Ma

[11] Patent Number: 5,768,102
[45] Date of Patent: Jun. 16, 1998

[54] CPU HEAT DISSIPATING DEVICE

[76] Inventor: Hsi-Kuang Ma, 4F, No. 48, Sec. 2, Chung Cherng Rd., Taipei, Taiwan

[21] Appl. No.: 695,914

[22] Filed: Aug. 12, 1996

[51] Int. Cl.$^6$ .................................................. H05K 7/20
[52] U.S. Cl. ............................................ 361/695; 361/809
[58] Field of Search ........................... 361/689, 690, 361/694–697, 707, 807, 809–811

[56] References Cited

FOREIGN PATENT DOCUMENTS

| 6177565 | 6/1994 | Japan | 361/695 |
|---|---|---|---|
| 6177566 | 6/1994 | Japan | 361/695 |

OTHER PUBLICATIONS

IBM Tech. Disclosure Bulletin, "Cooling of Single Chip Module or Multi Chip Module with Surface Mount Array Process", vol. 36, No. 07, Jul. 1993, pp. 101–102, 361/695.

Primary Examiner—Gregory D. Thompson
Attorney, Agent, or Firm—Bacon & Thomas

[57] ABSTRACT

A CPU heat dissipating device including a CPU mount having a center opening and a plurality of raised portions spaced around the center opening at the top, a CPU mounted on the CPU mount and spaced from the top side of the CPU mount by the raised portions thereof, a heat sink attached to the CPU at the top, and a fan controlled to draw outside air into the center opening of the CPU mount, permitting it to be forced horizontally outwards through the gap between the CPU mount and the CPU in all directions.

2 Claims, 5 Drawing Sheets

CPU HEAT DISSIPATING DEVICE

BACKGROUND OF THE INVENTION

The present invention relates to CPU heat dissipating devices, and relates more particularly to such a CPU heat dissipating device which efficiently carries heat away from the CPU.

When the CPU (central processing unit) of an electronic instrument for example a computer is operated, it consumes much power for example from 1–3W to 8–15W, and release much heat. During the operation of the computer, heat must be quickly carried away from the CPU so that the working temperature can be maintained within the designed range. FIGS. 1 and 2 show a CPU heat dissipating device according to the prior art. This structure comprises a CPU mount A mounted on a circuit board B, a CPU C mounted on the CPU mount A, a heat sink D closely attached to the CPU C at the top, and a fan E mounted on the heat sink D at the top. When the fan E is operated, heat is quickly carried away from the heat sink D. However, because the CPU C is closely attached to the top side of the CPU mount A and the fan is supported on the heat sink D above the CPU C, heat can only be carried away from the periphery of the heat sink D. Therefore, hot air tends to linger about around the heat sink and the fan.

SUMMARY OF THE INVENTION

The present invention has been accomplished to provide a CPU heat dissipating device which eliminates the aforesaid problem. According to one embodiment of the present invention, the CPU heat dissipating device comprises a CPU mount having a center opening and a plurality of raised portions spaced around the center opening at the top, a CPU mounted on the CPU mount and spaced from the top side of the CPU mount by the raised portions thereof, a heat sink attached to the CPU at the top, and a fan controlled to draw outside air into the center opening of the CPU mount, permitting it to be forced horizontally outwards through the gap between the CPU mount and the CPU in all directions. As an alternate form of the present invention, the fan is mounted within the center opening of the CPU mount, having projecting lugs supported above the periphery of the center opening of the CPU mount to space the CPU above the top side of the CPU mount.

DETAILED DESCRIPTION OF THE PREFERRED EMBODIMENT

Figure 1:
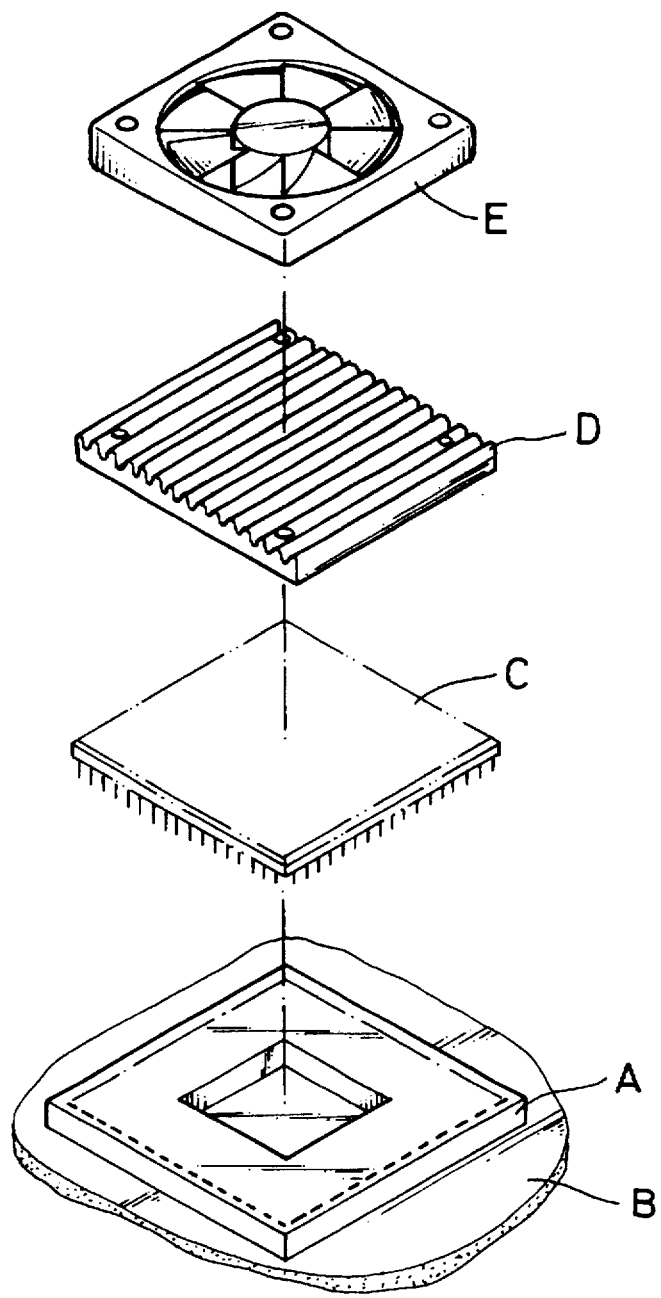
FIG. 1 is an exploded view of a CPU heat dissipating device according to the prior art.
Figure 2:
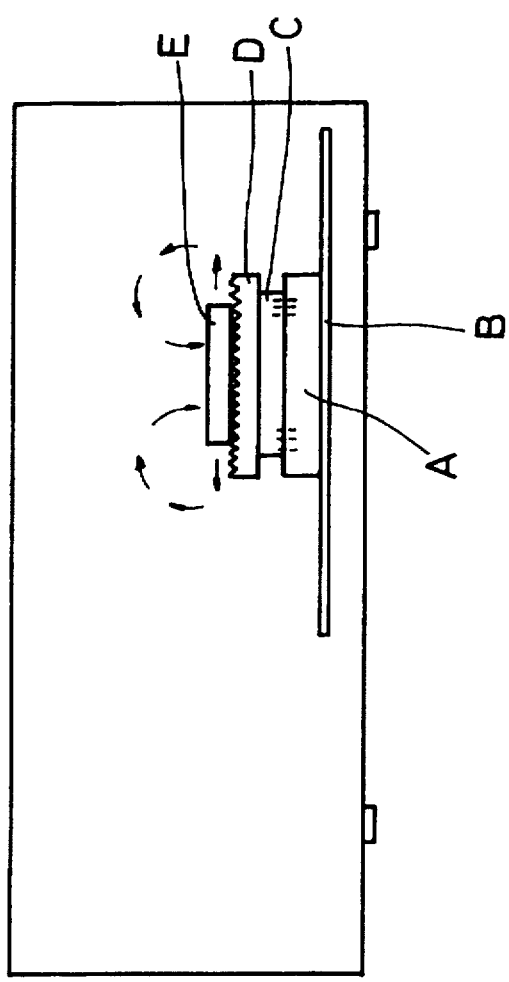
FIG. 2 is a sectional assembly view of FIG. 1.
Figure 3:
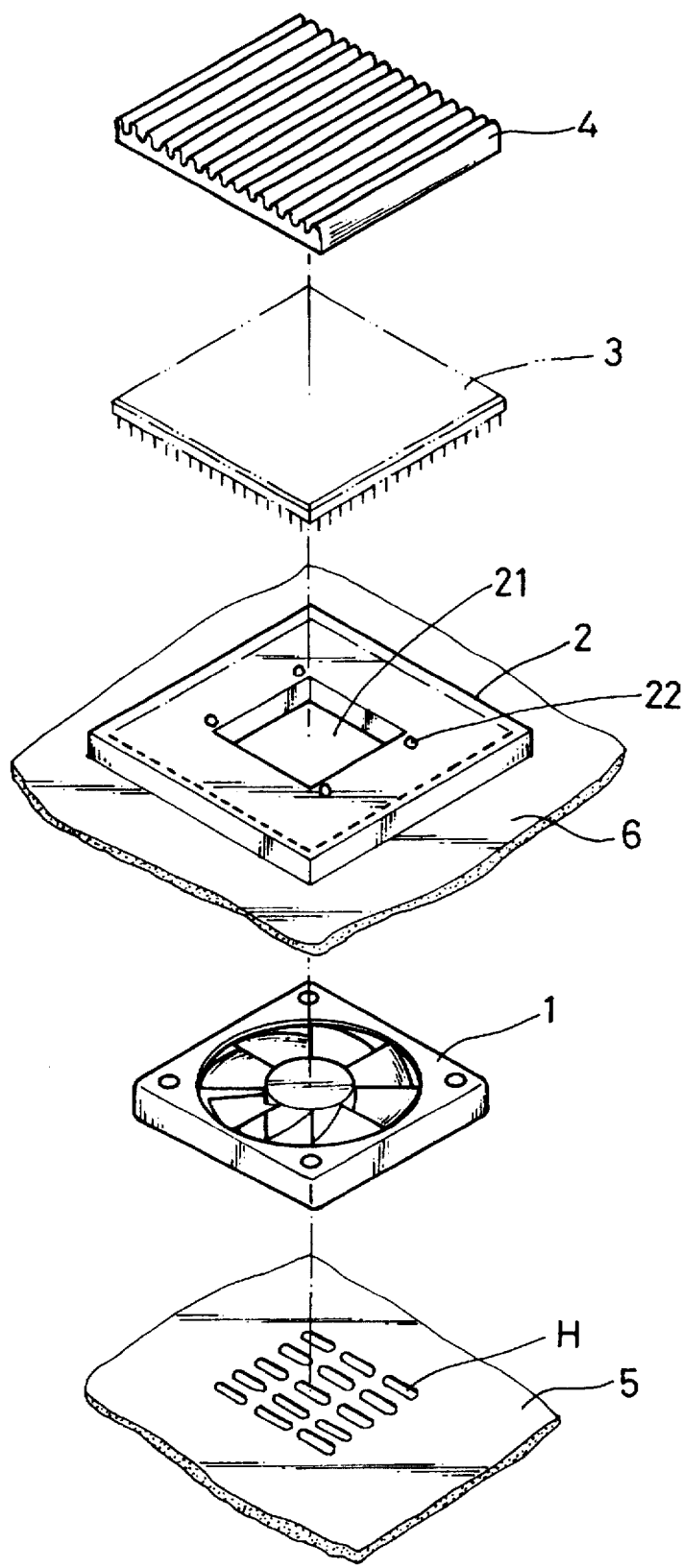
FIG. 3 is an exploded view of a CPU heat dissipating device according to the present invention.
Figure 4:
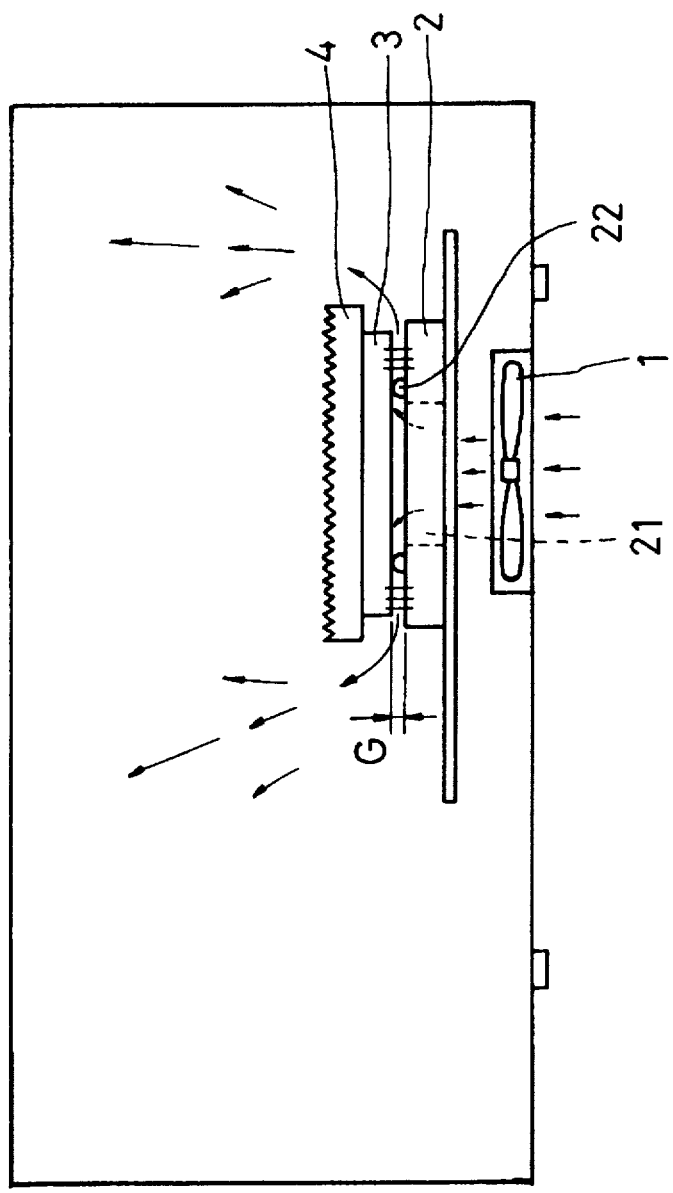
FIG. 4 is a sectional assembly view of FIG. 3.

Referring to FIGS. 3 and 4, a CPU heat dissipating device in accordance with the present invention is generally comprised of a fan 1, a CPU mount 2, a CPU 3, and a heat sink 4. The fan 1 is mounted on a shell 5 over a plurality of air vents H thereof for drawing in outside fresh air and sending it upwards. The CPU mount 2 is mounted on a circuit board 6, having a center opening 21 in alignment with the fan 1 through which upwards currents of air pass, and a plurality of raised portions 22 raised from the top around the center opening 21. The height of the raised portions 22 is preferably within 2 mm. The CPU 3 is mounted on the CPU mount 2 and spaced from the top surface of the CPU mount 2 by the raised portions 22, having contact pins respectively connected to respective contact holes in the CPU mount 2. When the CPU 3 is installed in the CPU mount 2, a gap G is defined between the bottom side of the CPU 3 and the top side of the CPU mount 2. The heat sink 4 is made from metal, and closely attached to the CPU 3 at the top to quickly dissipate heat from the CPU 3 into the air.

Referring to FIG. 4, when the fan 1 is operated, currents of air are drawn through the air vents H into the center opening 21 of the CPU mount 2, and then forced to pass through the gap G between the CPU mount 2 and the CPU 3 and then to flow upwards in all directions, therefore heat is quickly carried away from the CPU 3 and the heat sink 4.

Figure 5:
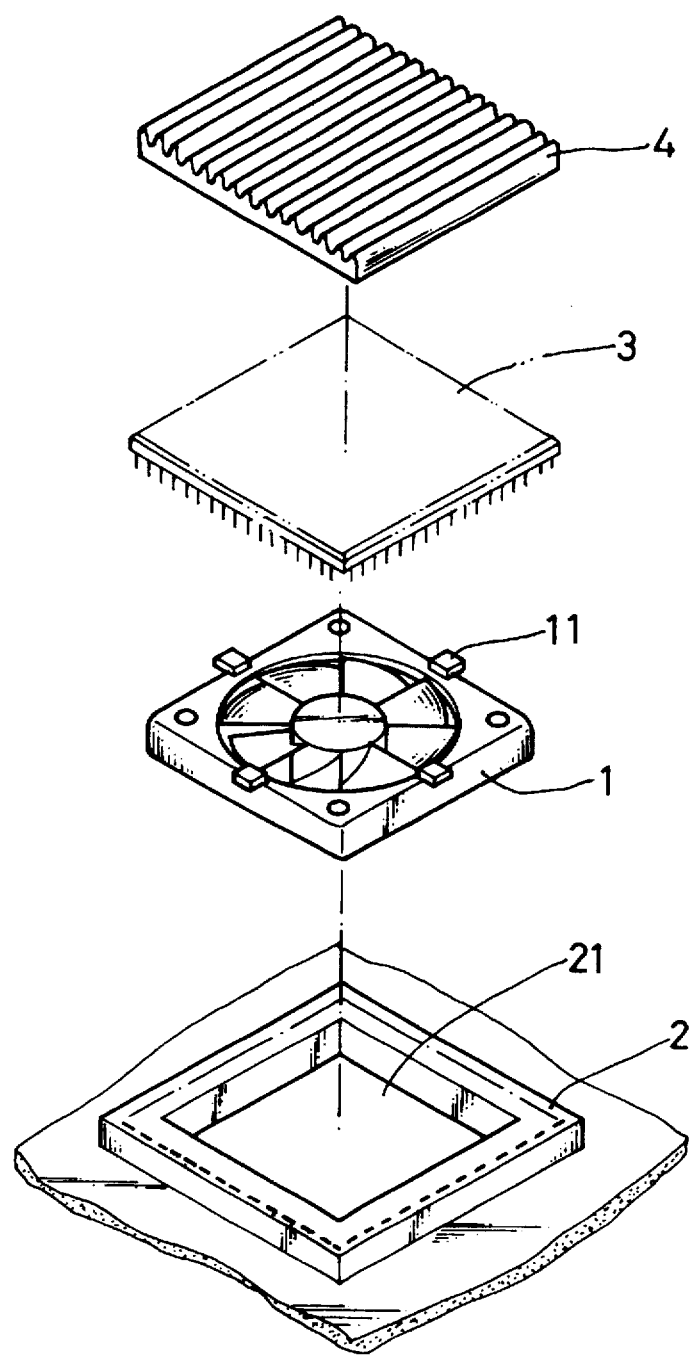
FIG. 5 is an exploded view of an alternate form of the present invention.

FIG. 5 shows an alternate form of the present invention, in which the size of the center opening 21 of the CPU mount 2 fits the fan 1; the fan 1 is mounted within the center opening 21 of the CPU mount 2, having equiangularly spaced projecting lugs 11 raised from the top and protruding over the periphery and supported above the periphery of the center opening 21 of the CPU mount 2; the CPU 3 is mounted on the CPU mount 2 and spaced from the top side of the CPU mount 2 by the projecting lugs 11.

It is to be understood that the drawings are designed for purposes of illustration only, and are not intended as a definition of the limits and scope of the invention disclosed.

What the invention claimed is:

1. A CPU heat dissipating device comprising a CPU mount including a center opening formed therein for passing ventilation air therethrough, a top side, and a plurality of raised portions extending from the top side around the center opening for spacing a CPU from the top side of the mount and permitting ventilation air received through the center opening to be directed horizontally outwardly through the spacing.

2. The CPU heat dissipating device of claim 1 further including a fan disposable below the CPU mount for passing ventilation air through the center opening and a heat sink for attachment to a top side of the CPU.

* * * * *